(12) United States Patent
Lai et al.

(10) Patent No.: US 6,530,792 B2
(45) Date of Patent: Mar. 11, 2003

(54) COVER CONNECTING MECHANISM

(75) Inventors: Chengshing Lai, TaiPei (CN); Wenyuan Huang, Nanjing (CN)

(73) Assignee: Inventec Electronics (Nanjing) Co., Ltd., Nanjing (CN)

( * ) Notice: Subject to any disclaimer, the term of this patent is extended or adjusted under 35 U.S.C. 154(b) by 0 days.

(21) Appl. No.: 09/874,834

(22) Filed: Jun. 5, 2001

(65) Prior Publication Data

US 2002/0067590 A1 Jun. 6, 2002

(30) Foreign Application Priority Data

Jun. 20, 2000 (CN) .......................................... 00 1 16618

(51) Int. Cl.⁷ ............................................... H01R 3/00
(52) U.S. Cl. ......................... 439/165; 439/8; 439/446; 439/492; 439/31; 439/67
(58) Field of Search ............................ 439/165, 492, 439/67, 446, 31, 8; 361/681

(56) References Cited

U.S. PATENT DOCUMENTS

| | | | | |
|---|---|---|---|---|
| 4,842,531 A | * | 6/1989 | Takemura | 439/165 |
| 4,961,126 A | * | 10/1990 | Suzuki | 439/165 |
| 5,681,176 A | * | 10/1997 | Ibaraki et al. | 439/165 |
| 5,995,373 A | * | 11/1999 | Nagai | 439/165 |

* cited by examiner

Primary Examiner—Tho D. Ta
(74) Attorney, Agent, or Firm—Merchant & Gould P.C.

(57) ABSTRACT

The present invention provides a cover connecting mechanism which is used for connecting the cover to the main body of an electronic product, including: at least one FPC used for communication data amission; a connector made of elastically deformable material which partially wraps the FPC while exposing its two ends. The two exposed FPC ends are connected to the cover and the printed circuit board in the main body to enable the transmission of communication data.

6 Claims, 4 Drawing Sheets

COVER CONNECTING MECHANISM

FIELD OF THE INVENTION

The present invention relates to a cover connecting mechanism, particularly to a cover connecting mechanism which has simultaneously the function of connecting the cover to the main body and the function of transmitting the communication data between the cover and the man body.

BACKGROUND OF THE INVENTION

In the personal electronic products currently available in the market such as personal digital assistant (PDA), electric dictionary, language translation machine, palmtop and notebook computers, as shown in FIG. 1 and FIG. 2, the cover 1 is connected to the main body 2 through an axle 3 in a freely opening and closing manner, while the data communication transmission between the cover 1 and he main body 2 is achieved by using a flexible printed circuit (FPC) (not shown in the drawings embedded in the axle 3.

The size of FPC containing axle 3 depends on the communication volume (number of PINs) of FPC, i.e. the axle 3 should be correspondingly larger if the FPC communication volume is larger, and the axle 3 should be correspondingly smaller if the FPC volume is smeller. However, this would impel the manufacturer to produce covers and main bodies of various sizes corresponding to the larger or smaller axles, which would inevitably, increase manufacturing cost.

On the other hand, if the manufacturer produces the axle of uniformed size to reduce the cost, then the FPC communication volume will be correspondingly limited, i. e. in order to be adapted to the axle 3 of uniformed size, the communication volume of the FPC has to be limited accordingly which imposes limitation to the functions of the electronic product.

Furthermore, as shown in FIG. 1 and FIG. 2, the pivoting freedom of the prior art axle 3 is also affected by the thickness of the cover 1 and the main body 2, the cover can't be rotated to 360°, which greatly affects the convenience in use.

SUMMARY OF THE INVENTION

Therefore in order to overcome the above drawbacks, the present invention provides a cover connecting mechanism, which aims to eliminate the unfavorable interaction between the FPC transmission volume and the size of the connecting structure, i.e. the size of the axle. Meanwhile, the cover can freely opened to any angle within 360°.

The cover connecting mechanism for the above purpose includes at least one PPC for the data transmission and a connector made of elastically deformable material which wraps the FPC partially while exposing the two ends of the FPC. Wherein, each of the two exposed ends of the FPC is respectively linked to the cover and the circuit board placed in main body in a data transmissible mode. The two side flanges of the elastically deformable connector which correspond to the exposed ends of FPC are foxed respectively to the cover and the main body in such a manner that the cover which is connected to the main body through the elastically deformable connector can be rotated to any angle. Besides, data can be transmitted freely between the cover and the main body through the FPC partially wrapped by the connector.

BRIEF DESCRIPTION OF THE DRAWINGS

In the following, a detailed description of an embodiment according to the present invention will be made with reference to the accompanying drawings. Among the drawings.

DETAILED DESCRIPTION OF THE PREFFERED EMBODIMENTS

Figure 1:
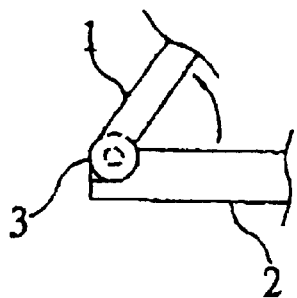
FIG. 1 is a partial schematic view of the electronic product using the prior art cover connecting mechanism.
Figure 2:
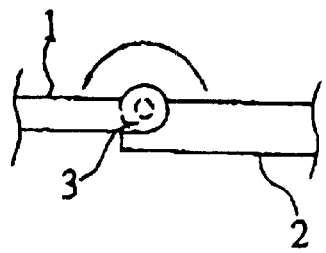
FIG. 2 is a schematic view shoring the cover of the electronic product shown in FIG. 1 is rotated to its end position.
Figure 3:
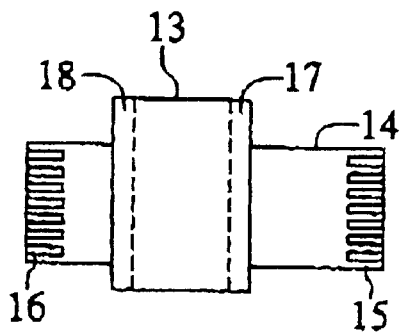
FIG. 3 is a plan view of the cover connecting mechanism according to the present invention.
Figure 4:
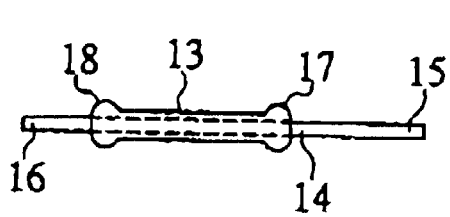
FIG. 4 is a side view of the cover connecting mechanism shown in FIG. 3.

As shown in FIG. 3 and FIG. 4, the cover connecting mechanism according to the present invention includes one FPC 14 for data transmission and a connector 13 made of elastically deformable material such as rubber which partially wraps FPC 14 with its two ends 15, 16 exposed Wherein these two exposed ends 15, 16 are connected to the cover and the circuit board (not shown) of the electronic product respectively in a data a sible mode. Besides, on the two sides of the connector 13 which correspond to the two exposed ends 15, 16 of the FPC are formed the connecting portions 17, 18 so that the connector 13 can be connected and fixed respectively to the cover and the main body and the cover of the electronic product can rotated to any angle via the elastically deformable connector 13, meanwhile the data transmission can be achieved between the cover and the main body of the electronic product via FPC 14.

In the following, a preferred embodiment will be described in which the present invention is used in a PDA mobile phone.

Figure 5:
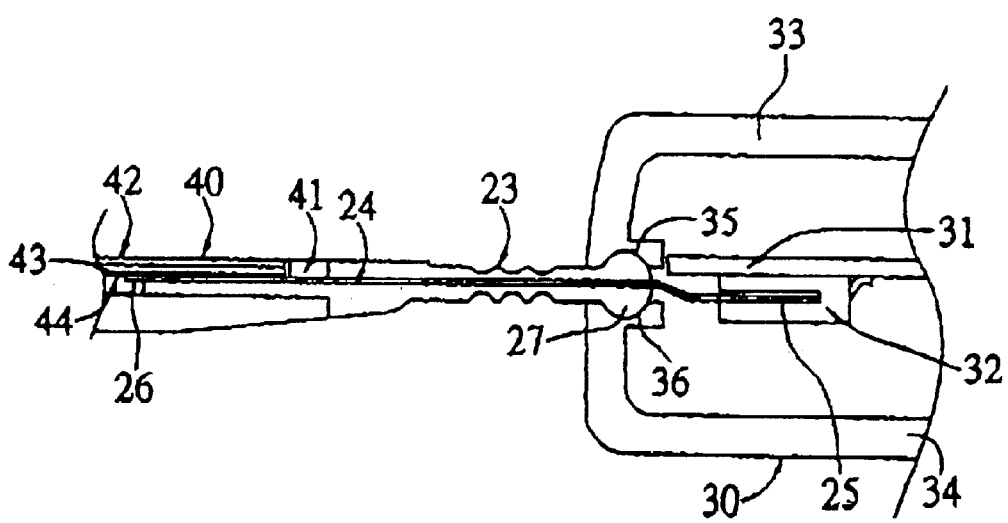
FIG. 5 is a schematic sectional view of a preferred embodiment in which the present invention is used in a PDA mobile phone.

As shown in FIG. 5 by means of die forming, the cover connecting mechanism integrates FPC 24 with the connector 23 made of elastically deformable material such as rubber which partially wraps the FPC 24 while exposing its two ends 25, 26. On the side flanges of the connector 23 which are connected to the main body 30 of the PDA mobile phone are formed enlarged end portions 17, so that the end 25 of FPC 24 which corresponds to the main body 30 can be inserted into the connector 32 on the circuit board 31 in main body and the data is transmissible between the FPC 24 and the circuit board 31 in the main body 30. The main body 30 can hole the enlarged end portions 27 on the connector 23 by the fixing slot 35, 36 located in the upper & lower shell 33 and 34 so that the connector 23 cam be fixed to the main body 30.

The side flanges on the connector 23 which is to be conceded to the PDA mobile phone can allow the connector to be fixed on the cover 40 by its integration with the preformed cover shell 41 while the FPC 24 is integrated with the connector 23 through die forming so that the connector 23 can be fixed to the cover 40. The FPC end 26 exposed out of the connector 23 is connected to the circuit board 44 in the cover 44 tightly by the pressing of the metal plate 43 disposed beneath the cover panel 42, thereby the data transmission can be achieved freely between the FPC 24 and the circuit board 44 in the cover.

Figure 6:
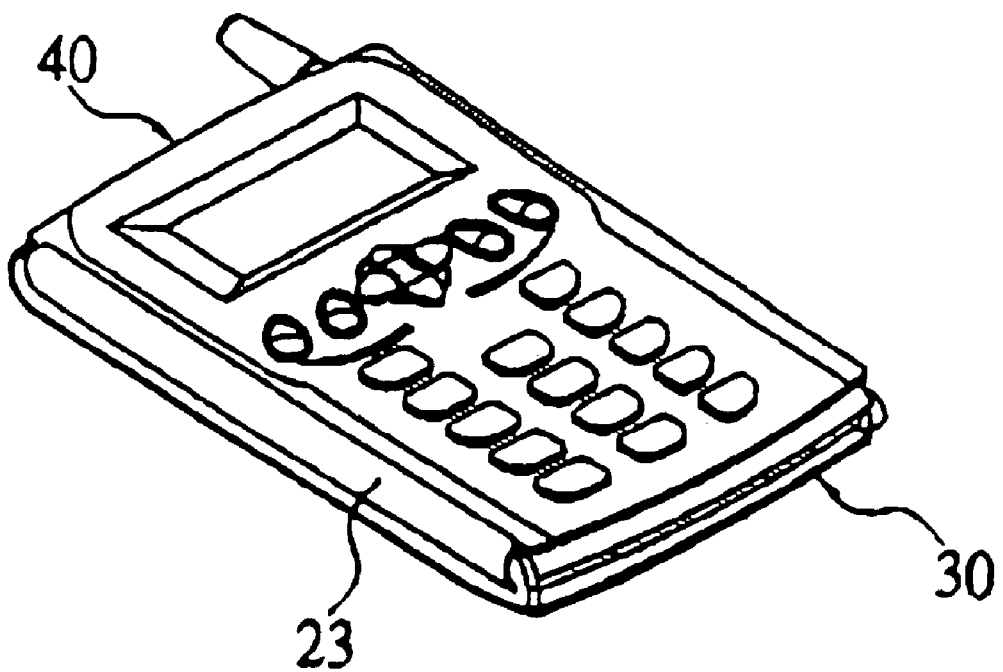
FIG. 6 is a perspective view showing the cover of the PDA mobile phone is closed.
Figure 7:
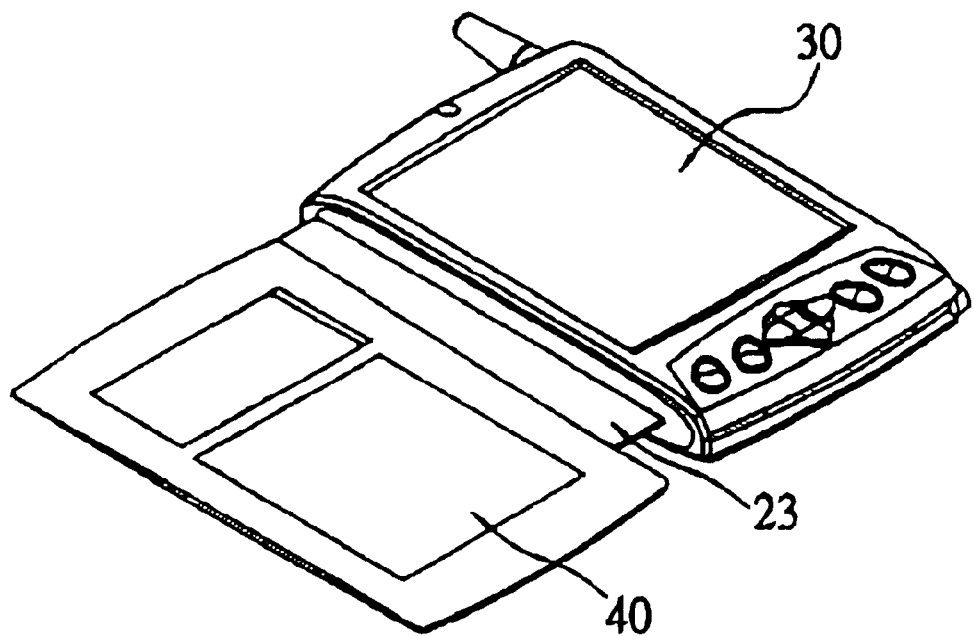
FIG. 7 is a schematic perspective view showing the cover of the PDA mobile phone shown in FIG. 6 is rotated to 180°.
Figure 8:
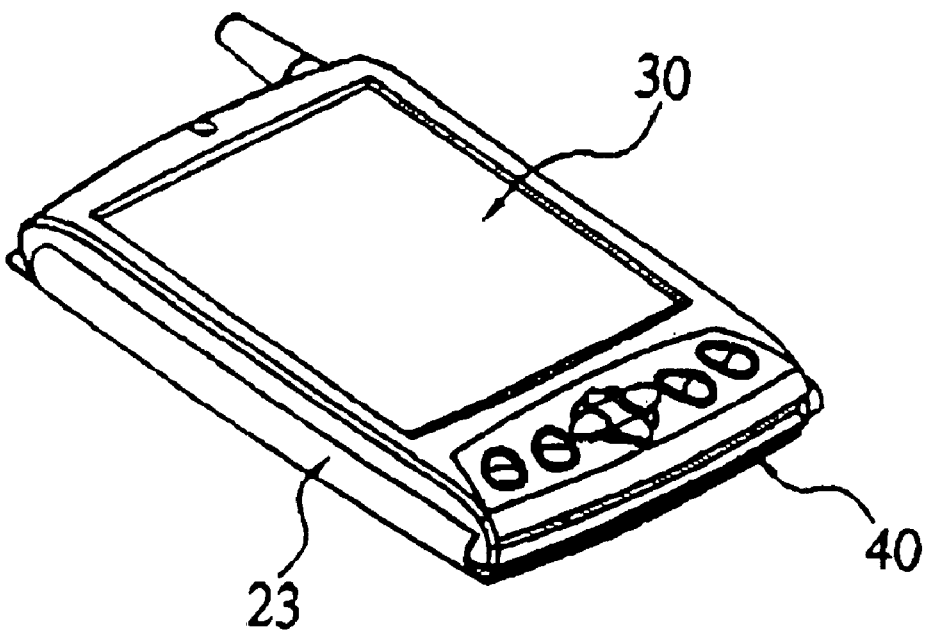
FIG. 8 is schematic perspective view showing the cover of the PDA mobile phone shown in FIG. 6 is rotated to 360°.

The connector connected to the main body 30 and the cover 40 of the PDA mobile phone by means of the above mode is made of the elastically deformable material so that the cover 40 can be rotated finely from 0° to 360° and the date transmission can be achieved freely between the main body 30 and the cover 40 through the FPC wrapped partially by the connector 30 without any limitation caused by the communication volume (number of PINs). In this embodiment, as shown in FIG. 6, when the cover is fully closed to the main body, the electronic product can be use as a mobile phone. As shown in FIG. 7, if the cover is opened- and turned away form the main body 30, the product can be used as a PDA. Since there is no any angle restriction on the pivoting of the cover connecting mechanism, the user can turn over the cover 40 up to 360° to adhere the cover 40 to the bottom of the main body 30 as shown in FIG. 8, which facilitate the user to hold the main body 30 by one hand and to operate the PDA by the other band.

From the above, one can know that the cover connecting mechanism using the elastically deformable connector can replace the conventional axle structure, enabling the cover to be connected to the main body with free opening and closing and the data transmission can be achieved freely between the cover and the main body through the FPC wrapped partially by the connector. The angle restriction in the conventional axle no longer presents as a problem and the size of the connector is no longer required to vary according to the FPC of different volumes. Since the elasticity of the connector will not unfavorably affect the connection between the cover and the main body and the opening of the cover, the unfavorable interaction between the conventional axle and the FPC transmission volume will no longer present. In addition, since the FPC is wrapped by the flexible and elastically deformable connector, the protection to the FPC is improved and the sharp bending of the FPC can be avoided, thereby the antibending performance is enhanced and the purpose of concealing the FPC is realized at the same time.

It is to be noted that the above embodiment is described by way of an example to illustrate the present invention, the present invention is not limited to the above described embodiment, various modifications, alterations or equivalent changes can be made to the present invention without departing from the spirit and principle of the present invention for example, instead of being formed into an integral whole, the FPC can be inserted and fixed into the gap in the middle of the connector; wrapping partially the FPC by covering and fixing FPC by two plate-shaped connecting components or using other fixing means such as welding, filing, sticking, embedding, tenon-mortise connection to the fix the two ends of the connector respectively to the main body and the cover of the electronic product etc., all these will fall into the scope of protection defined by the appended claims.

What is claimed is:

1. A cover connecting mechanism, used for connecting a cover to a main body of an electronic product, including at least one flexible printed circuit used for data transmission, and a connector made by an elastically deformable material to wrap the flexible printed circuit partially while exposing its two ends, the connector having an enlarged end portion, the enlarged end portion being receivable in the main body, whereby the main body can hold the enlarged end portion on the connector so that the connector can be fixed to the main body.

2. The cover connecting mechanism according to claim 1, wherein the two exposed ends of the flexible printed circuit are connected to the cover and a circuit board in the main body respectively to enable data transmission.

3. The cover connecting mechanism according to claim 1, wherein said connector is made of rubber.

4. The cover connecting mechanism according to claim 1, wherein the flexible printed circuit and the connector partially wrapping the flexible printed circuit are formed into an integral whole.

5. The cover connecting mechanism according to claim 1, wherein the flexible printed circuit and the connector which wraps partially the flexible printed circuit can be made together by inserting the flexible printed circuit into a gap formed in the middle of the connector.

6. The cover connecting mechanism according to claim 1, wherein the flexible printed circuit and the connector partially wrapping the flexible printed circuit are made together in such a way that two plate-shaped connecting components first cover the flexible printed circuit, then the two plate-shaped connecting components are fixed to the flexible printed circuit and plated together.

\* \* \* \* \*